(12) United States Patent
Wei et al.

(10) Patent No.: US 12,107,162 B2
(45) Date of Patent: Oct. 1, 2024

(54) MULTI-GATE SEMICONDUCTOR STRUCTURE AND METHOD OF MANUFACTURING THE SAME

(71) Applicant: Winbond Electronics Corp., Taichung (TW)

(72) Inventors: Hung-Yu Wei, Chiayi (TW); Pei-Hsiu Peng, Taichung (TW); Kai Jen, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 497 days.

(21) Appl. No.: 17/132,293

(22) Filed: Dec. 23, 2020

(65) Prior Publication Data
US 2021/0257491 A1    Aug. 19, 2021

(30) Foreign Application Priority Data
Feb. 15, 2020    (TW) .................... 109104860

(51) Int. Cl.
*H01L 29/78*    (2006.01)
*H01L 21/77*    (2017.01)
(Continued)

(52) U.S. Cl.
CPC .......... *H01L 29/7831* (2013.01); *H01L 21/77* (2013.01); *H01L 21/823431* (2013.01);
(Continued)

(58) Field of Classification Search
CPC ............. H01L 29/0653; H01L 29/4236; H01L 27/0886; H01L 29/66795; H01L 29/785;
(Continued)

(56) References Cited

U.S. PATENT DOCUMENTS 7,098,515 B1 *  8/2006  Gu ................... H01L 21/76897
                                                                257/E21.627
7,105,908 B2 *  9/2006  Lee ....................... H10B 10/00
                                                                            257/515

(Continued)

FOREIGN PATENT DOCUMENTS

CN    110854196 A    2/2020
TW    201312659 A    3/2013
(Continued)

OTHER PUBLICATIONS

Office Action issued in corresponding TW patent application No. 109104860 on Dec. 11, 2020.
(Continued)

*Primary Examiner* — Maliheh Malek
(74) *Attorney, Agent, or Firm* — MUNCY, GEISSLER, OLDS & LOWE, P.C.

(57) ABSTRACT

A multi-gate semiconductor structure and its manufacturing method are provided. The semiconductor structure includes a substrate having an active area and an isolation structure adjacent to the active area. The semiconductor structure includes a gate structure formed on the substrate and a gate dielectric layer between the gate structure and the substrate. The gate structure includes a first part above the top surface of the substrate and a second part connected to the first part. The second part of the gate structure is formed in the isolation structure, wherein the isolation structure is in direct contact with the bottom surface and sidewalls of the second part of the gate structure. A method of manufacturing the semiconductor structure includes partially etching the isolation structure to form a trench exposing the top portion of
(Continued)

sidewalls of the substrate. The gate dielectric layer and the gate structure extend into the trench.

18 Claims, 10 Drawing Sheets

(51) Int. Cl.
  *H01L 21/8234* (2006.01)
  *H01L 21/8238* (2006.01)
  *H01L 29/417* (2006.01)
  *H01L 29/66* (2006.01)
  *H01L 21/84* (2006.01)
  *H01L 27/088* (2006.01)

(52) U.S. Cl.
  CPC .. *H01L 29/66484* (2013.01); *H01L 29/66795* (2013.01); *H01L 29/785* (2013.01); *H01L 21/823821* (2013.01); *H01L 21/845* (2013.01); *H01L 27/0886* (2013.01); *H01L 29/41791* (2013.01)

(58) Field of Classification Search
  CPC ....... H01L 21/823431; H01L 29/66545; H01L 21/823456; H01L 29/0649; H01L 29/42368; H01L 29/42376; H01L 29/66659; H01L 29/7835; H01L 21/76229; H01L 21/823481; H01L 29/6659; H01L 29/66621; H01L 29/7833; H01L 29/7851; H01L 21/31116; H01L 21/823412; H01L 21/823437; H01L 27/088; H01L 29/0847; H01L 29/1095; H01L 29/407; H01L 29/66636; H01L 29/66704; H01L 29/7825; H01L 29/7848; H01L 21/0228; H01L 21/31105; H01L 21/76224; H01L 21/82345; H01L 21/823462; H01L 21/823475; H01L 29/0878; H01L 29/165; H01L 29/4925; H01L 29/4966; H01L 29/665; H01L 29/6653; H01L 29/6656; H01L 21/265; H01L 21/28061; H01L 21/28123; H01L 21/283; H01L 21/30608; H01L 21/3065; H01L 21/308; H01L 21/324; H01L 21/4846; H01L 21/67248; H01L 21/76202; H01L 21/76232; H01L 21/76895; H01L 21/82; H01L 21/823418; H01L 21/823468; H01L 21/823821; H01L 21/84; H01L 23/535; H01L 27/0629; H01L 27/1203; H01L 27/14603; H01L 27/1461; H01L 27/14614; H01L 27/14616; H01L 27/1463; H01L 27/14641; H01L 27/14643; H01L 27/14689; H01L 28/20; H01L 28/60; H01L 29/0638; H01L 29/0696; H01L 29/1083; H01L 29/1087; H01L 29/16; H01L 29/401; H01L 29/40114; H01L 29/402; H01L 29/41791; H01L 29/42324; H01L 29/4238; H01L 29/4983; H01L 29/66181; H01L 29/66553; H01L 29/6681; H01L 29/66818; H01L 29/66825; H01L 29/7816; H01L 29/7834; H01L 29/7836; H01L 29/7842; H01L 29/7855; H01L 29/7881; H01L 29/945; H01L 29/7831; H01L 29/66484; H10B 41/41; H10B 12/0385; H10B 12/05; H10B 12/09; H10B 12/37; H10B 12/373; H10B 41/10; H10B 41/27; H10B 41/35;
H10B 43/40; G06F 30/392; G11C 16/0483; G11C 16/14; G11C 16/24; G11C 16/26

See application file for complete search history.

(56) References Cited

U.S. PATENT DOCUMENTS

| | | | | |
|---|---|---|---|---|
| 7,763,508 B2* | 7/2010 | Pal | ............ | H01L 21/28114 |
| | | | | 438/303 |
| 7,932,143 B1* | 4/2011 | Pal | ............ | H01L 21/28247 |
| | | | | 438/296 |
| 9,368,496 B1* | 6/2016 | Yu | ............ | H01L 29/7855 |
| 9,368,596 B2* | 6/2016 | Liaw | ............ | H01L 29/6659 |
| 9,478,551 B2* | 10/2016 | Kim | ............ | H10B 10/12 |
| 9,721,806 B2* | 8/2017 | Fang | ............ | H01L 29/7835 |
| 9,824,931 B2* | 11/2017 | Tseng | ............ | H01L 21/0228 |
| 10,468,410 B2* | 11/2019 | Lin | ............ | H01L 21/76224 |
| 10,741,555 B2* | 8/2020 | Lin | ............ | H01L 29/66568 |
| 10,861,951 B2* | 12/2020 | Lin | ............ | H01L 29/7834 |
| 11,239,313 B2* | 2/2022 | Lin | ............ | H01L 29/0653 |
| 11,626,433 B2* | 4/2023 | Hu | ............ | H01L 27/14689 |
| | | | | 257/292 |
| 11,810,959 B2* | 11/2023 | Lin | ............ | H01L 29/0847 |
| 2002/0135020 A1* | 9/2002 | Skotnicki | ......... | H01L 21/76264 |
| | | | | 257/E21.426 |
| 2005/0051867 A1* | 3/2005 | Lee | ............ | H10B 10/12 |
| | | | | 438/296 |
| 2007/0026629 A1 | 2/2007 | Chen et al. | | |
| 2007/0128789 A1* | 6/2007 | Lim | ............ | H01L 21/823481 |
| | | | | 257/E21.619 |
| 2007/0278576 A1* | 12/2007 | Kim | ............ | H01L 29/66795 |
| | | | | 257/E21.429 |
| 2008/0099834 A1* | 5/2008 | Willer | ............ | H01L 21/823431 |
| | | | | 438/270 |
| 2008/0299734 A1* | 12/2008 | Lee | ............ | H01L 29/66818 |
| | | | | 257/E21.409 |
| 2009/0078995 A1* | 3/2009 | Nakagawa | ......... | H01L 29/7813 |
| | | | | 438/270 |
| 2009/0256212 A1* | 10/2009 | Denison | ............ | H01L 29/7825 |
| | | | | 257/408 |
| 2009/0283825 A1* | 11/2009 | Wang | ............ | H01L 29/66621 |
| | | | | 257/E29.256 |
| 2010/0109056 A1* | 5/2010 | Pal | ............ | H01L 21/28247 |
| | | | | 257/288 |
| 2010/0163970 A1* | 7/2010 | Rakshit | ............ | H01L 29/66795 |
| | | | | 257/327 |
| 2013/0134490 A1* | 5/2013 | Nummy | ............ | H01L 21/4846 |
| | | | | 438/243 |
| 2014/0042527 A1* | 2/2014 | Lee | ............ | H01L 29/4236 |
| | | | | 257/330 |
| 2015/0115373 A1* | 4/2015 | Yu | ............ | H01L 29/66545 |
| | | | | 438/283 |
| 2015/0214341 A1* | 7/2015 | Shin | ............ | H01L 21/76202 |
| | | | | 438/425 |
| 2015/0263139 A1* | 9/2015 | Fujii | ............ | H01L 29/42324 |
| | | | | 257/296 |
| 2015/0349121 A1* | 12/2015 | Dasaka | ............ | H01L 29/66659 |
| | | | | 257/303 |
| 2015/0380297 A1* | 12/2015 | Yin | ............ | H01L 21/31144 |
| | | | | 438/296 |
| 2016/0111488 A1* | 4/2016 | Lu | ............ | H01L 21/76229 |
| | | | | 438/270 |
| 2016/0276476 A1* | 9/2016 | Fang | ............ | H01L 29/4236 |
| 2017/0110536 A1* | 4/2017 | Hsiao | ............ | G06F 30/392 |
| 2017/0154823 A1* | 6/2017 | Tseng | ............ | H01L 21/823437 |
| 2017/0213901 A1* | 7/2017 | Ho | ............ | H01L 21/283 |
| 2017/0288020 A1* | 10/2017 | Fang | ............ | H01L 29/0653 |
| 2018/0337033 A1* | 11/2018 | Pandey | ......... | H01L 21/823481 |
| 2018/0374752 A1 | 12/2018 | Zhou | | |
| 2019/0148375 A1* | 5/2019 | Lin | ............ | H01L 21/76224 |
| | | | | 257/394 |
| 2022/0406917 A1* | 12/2022 | Chen | ............ | H01L 27/0886 |
| 2023/0079098 A1* | 3/2023 | Togo | ............ | H10B 43/40 |
| | | | | 257/345 |

(56) References Cited

U.S. PATENT DOCUMENTS

| | | | |
|---|---|---|---|
| 2023/0082824 A1* | 3/2023 | Pulugurtha | H01L 29/785 257/401 |
| 2023/0111003 A1* | 4/2023 | Fujita | H01L 29/7833 257/384 |
| 2023/0209821 A1* | 6/2023 | Ishida | H10B 41/10 257/314 |

FOREIGN PATENT DOCUMENTS

| | | | |
|---|---|---|---|
| TW | 201924047 A | 6/2019 | |
| TW | I-680514 B | 12/2019 | |

OTHER PUBLICATIONS

Search Report issued in corresponding TW patent application No. 109104860 dated Dec. 15, 2020.
Office Action mailed May 17, 2021 in TW application No. 109104860, 8 pages.

\* cited by examiner

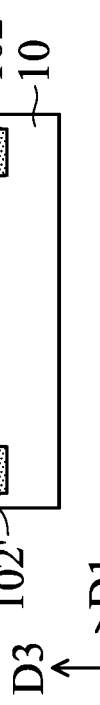
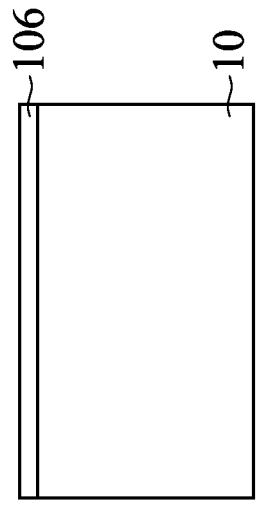
FIG. 3B
FIG. 3D
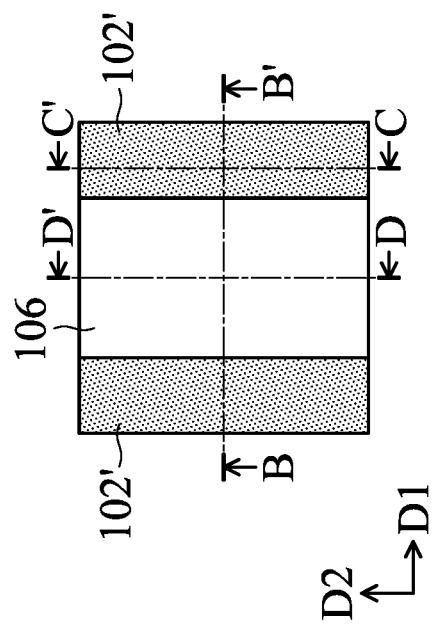
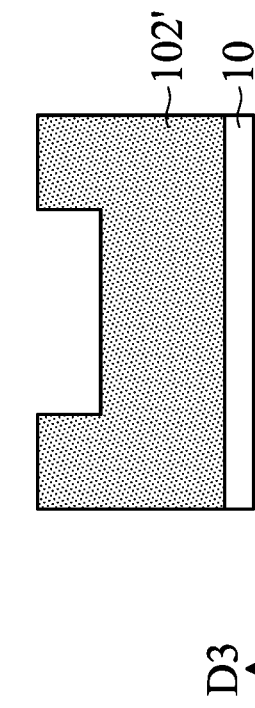
FIG. 3A
FIG. 3C

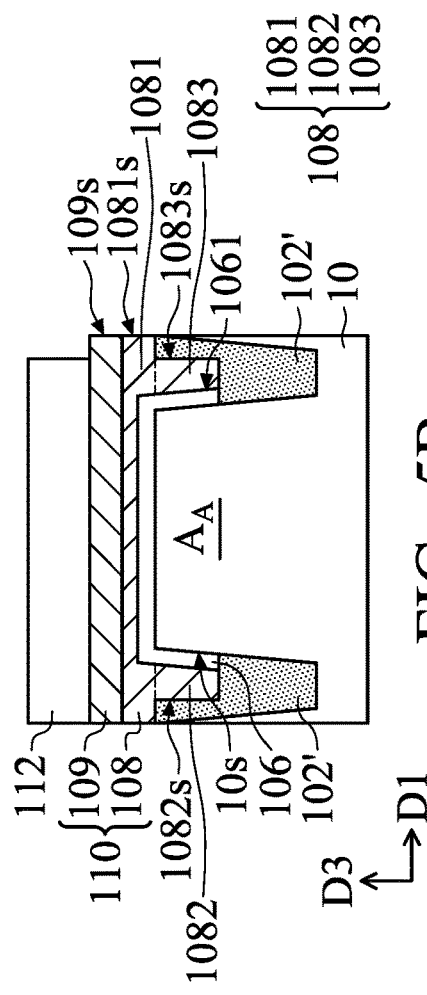
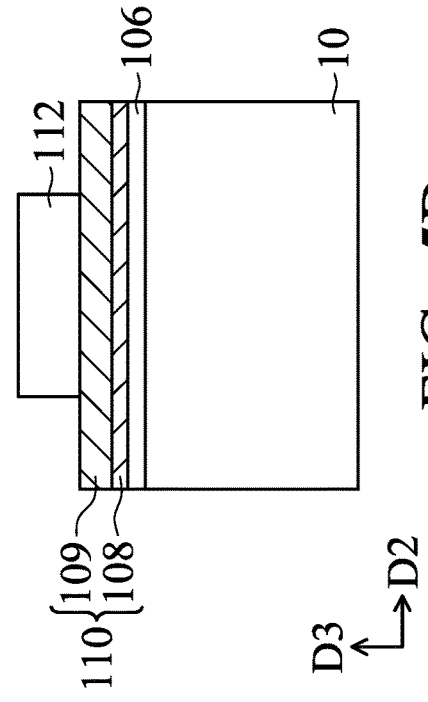
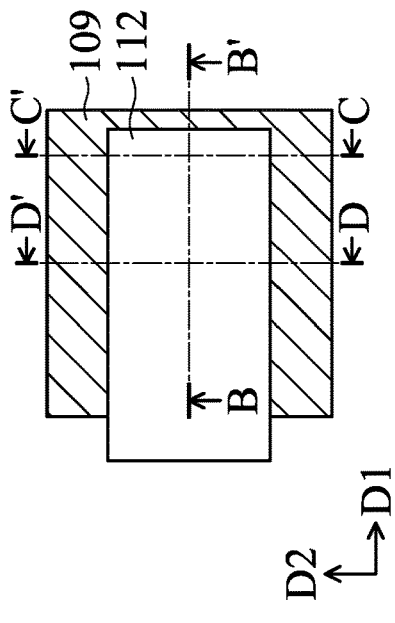
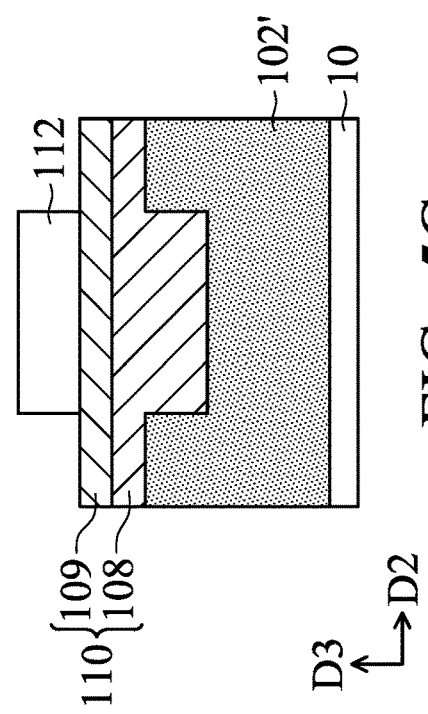
FIG. 5B
FIG. 5D
FIG. 5A
FIG. 5C

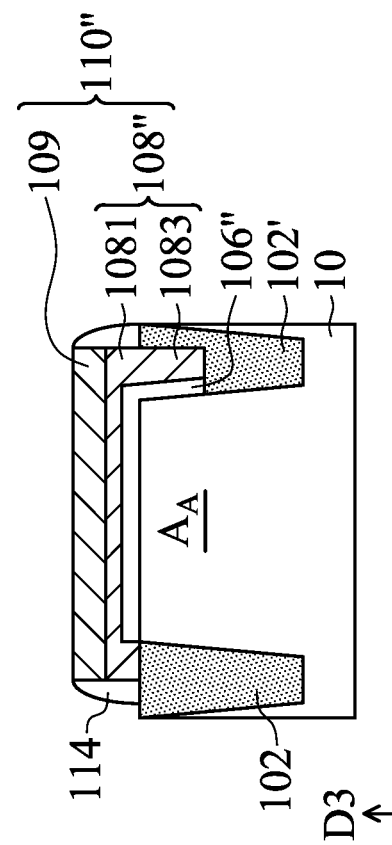
FIG. 9A
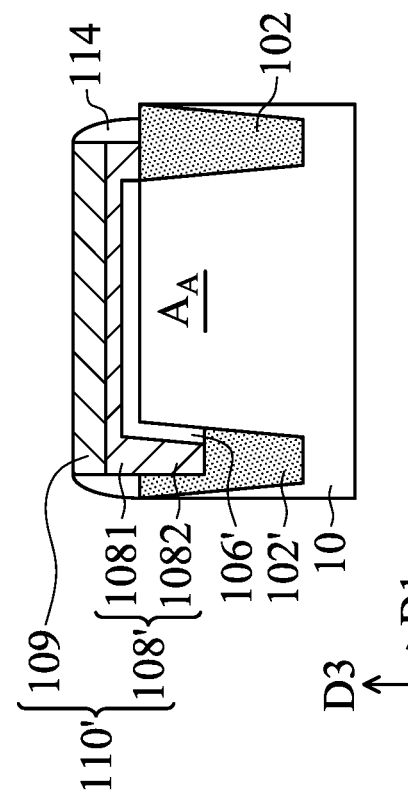
FIG. 9B
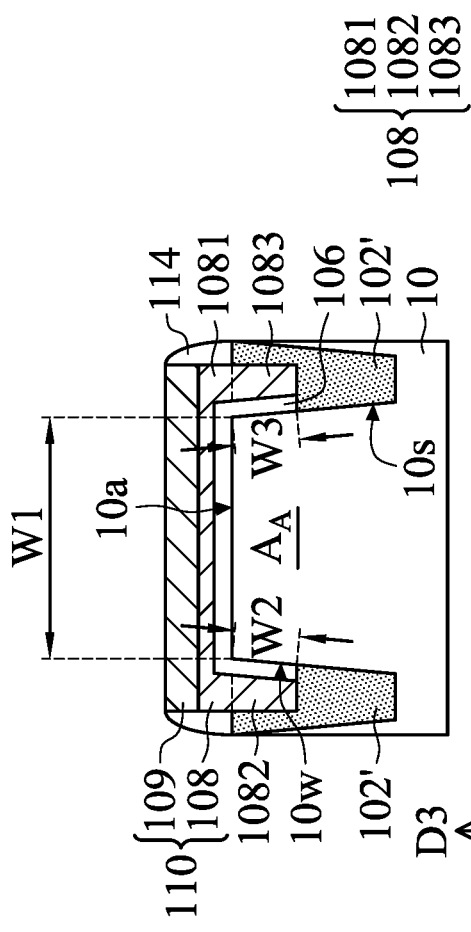
FIG. 8
FIG. 9C

MULTI-GATE SEMICONDUCTOR STRUCTURE AND METHOD OF MANUFACTURING THE SAME

CROSS REFERENCE TO RELATED APPLICATIONS

This application claims the benefit of Taiwan Application No. 109104860, filed on Feb. 15, 2020, the disclosure of which is hereby incorporated by reference herein in its entirety.

BACKGROUND

Field of the Disclosure

The present disclosure relates to a semiconductor structure and its manufacturing method, and in particular, it relates to a multi-gate semiconductor structure having at least one part extending in the isolation structure and its manufacturing method.

Description of the Related Art

With the rapid development of integrated circuits (ICs), the size of memory device components has been decreased, in order to meet the commercial requirements for miniaturized electronic devices. Take planar metal-oxide-semiconductor field-effect transistor (MOSFET) for example: the distance between the source electrode and the drain electrode on opposite sides of the gate electrode is decreased with the shrinkage of the size of the MOSFET. Therefore, the leakage current in an off state (off-state current) between a source electrode and a drain electrode of the semiconductor device is increased, which affects the electrical performance of the device. Accordingly, the integrated circuit manufacturers have developed semiconductor devices with fin structures, such as fin field-effect transistors (FinFETs) to increase the control ability of the gate electrode under the silicon substrate.

In a fin field-effect transistor, a substrate includes several protruding fin portions and several gate electrodes cross over the fin portions, wherein the gate electrodes cover the top surfaces and sidewalls of the fin portions. Accordingly, the channel of the fin field-effect transistor has reduced on-resistance, and the ability of the gate electrode for controlling the channel can be improved, thereby decreasing the current leakage. However, the fin field-effect transistor still has defects to be overcome. For example, parasitic capacitance will spontaneously occur between two conductive contacts (having at least the height of the fin portions) connecting the source electrode to the drain electrode. In particular, as electronic devices continue to shrink, the distance between the source electrode and the drain electrode on both sides of the gate electrode in the fin field effect transistor becomes smaller, and the conductive contacts formed above the source electrode and the drain electrode is also getting closer, resulting in the increase of the parasitic capacitance between the conductive contacts. Furthermore, in the FinFET structure, the protruding fin portions, the gate electrodes crossing and covering the sidewalls and top surfaces of the fin portions and the spacers formed on both sides of the gate electrodes are tall and can easily collapse and/or peel off during the manufacturing process. These problems decrease the production yield and reliability of the final product.

In addition, an electronic device may include several semiconductor components having different structures, thereby providing different electrical characteristics required by the electronic device. For example, the electronic device may include one or more high-voltage semiconductor devices and one or more low-voltage semiconductor devices. Also, it is expected that those improved semiconductor structures can be applicable in different electronic devices containing electronic components having different electrical characteristics. Generally, multiple manufacturing processes are required to complete the fabrication of these semiconductor devices with different structures, so that those manufacturing processes are more complicated and the manufacturing costs increase.

Although existing semiconductor structures and methods for manufacturing the same have generally been adequate for their intended purposes, they have not been entirely satisfactory in all respects. There are still some problems to be overcome in regards to the semiconductor structures and its manufacturing methods. Thus, it is important for manufactures to improve their semiconductor structures to prevent the above-mentioned situations. Also, it is expected that those improved semiconductor structures can be applicable in different electronic devices containing electronic components having different electrical characteristics.

SUMMARY

In some embodiments of the disclosure, a semiconductor structure with a multi-gate is provided. The semiconductor structure includes a substrate having an active area and an isolation structure adjacent to the active area. In some embodiments, the semiconductor structure also includes a gate structure formed on the substrate. The gate structure includes a first part above the top surface of the substrate and a second part connected to the first part. The second part of the gate structure is formed in the isolation structure, wherein the isolation structure is in direct contact with the bottom surface and sidewalls of the second part of the gate structure. In some embodiments, the semiconductor structure further includes a gate dielectric layer between the gate structure and the substrate. In some embodiments, a method of manufacturing the semiconductor structure includes partially etching the isolation structure to form a trench, wherein the trench exposes the top portion of the sidewalls of the substrate. Also, the gate dielectric layer and the gate structure that are formed in the embodiments extend into the trench.

In some embodiments of the disclosure, a method of manufacturing a semiconductor structure with a multi-gate is provided. In some embodiments, the method includes providing a substrate having an active area and an isolation structure adjacent to the active area, wherein the top surface of the isolation structure is level with the top surface of the substrate. In some embodiments, the method further includes partially etching the isolation structure to form a trench, wherein the trench exposes the top portion of the sidewall surfaces of the substrate. In some embodiments, the method also includes forming a gate dielectric layer on the substrate, wherein the gate dielectric layer extends to the trench and covers the top portion of the sidewall surfaces of the substrate. In some embodiments, the method further includes forming a gate structure on the gate dielectric layer. The gate structure includes a first part above the top surface of the substrate and a second part connected to the first part, wherein the second part formed in the trench, the isolation structure is in direct contact with the sidewalls and bottom surface of the second part.

BRIEF DESCRIPTION OF THE DRAWINGS

The present disclosure can be further understood by reading the subsequent detailed description and examples with references made to the accompanying drawings, wherein:

FIGS. 1A-1D, 2A-2D, 3A-3D, 4A-4D, 5A-5D, 6A-6D, 7A-7D illustrate a method of manufacturing a semiconductor structure in an electronic, in accordance with some embodiments of the present disclosure. FIGS. 1A, 2A, 3A, 4A, 5A, 6A and 7A are top views of substrates of intermediate stages of a method of manufacturing the semiconductor structure, in accordance with some embodiments. FIGS. 1B, 2B, 3B, 4B, 5B, 6B and 7B are cross-sectional views taken along sectional lines B-B' of the structures of FIGS. 1A, 2A, 3A, 4A, 5A, 6A and 7A, respectively. FIGS. 1C, 2C, 3C, 4C, 5C, 6C and 7C are cross-sectional views taken along sectional lines C-C' of the structures of FIGS. 1A, 2A, 3A, 4A, 5A, 6A and 7A, respectively. FIGS. 1D, 2D, 3D, 4D, 5D, 6D and 7D are cross-sectional views taken along sectional lines D-D' of the structures of FIGS. 1A, 2A, 3A, 4A, 5A, 6A and 7A, respectively.

FIG. 8 depicts a dispersive arrangement of several multi-gate devices and several planar devices on the substrate.

FIGS. 9A, 9B and 9C are cross-sectional views of the semiconductor structures, in accordance with some embodiments of the present disclosure.

DETAILED DESCRIPTION

Figure 1A:
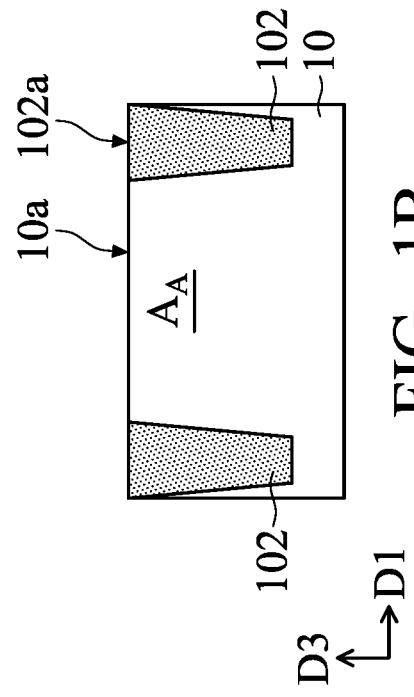

The present disclosure is described in detail with reference to the figures of the embodiments of the present disclosure. It should be appreciated, however, that the present disclosure can be embodied in a wide variety of implementations and is not limited to embodiments described in the disclosure. Various features may not be drawn to scale for the sake of simplicity and clarity. Some embodiments are described below. Throughout the various views and illustrative embodiments, similar reference numbers are used to designate similar features and components.

Embodiments of the present disclosure provide a semiconductor structure with a multi-gate and a method of manufacturing the same. Whether a device includes the semiconductor structure of the embodiment can be optionally determined according to the characteristics of the device to be formed in the application. According to the embodiments, a semiconductor structure with a multi-gate in the embodiments (i.e. a multi-gate device such as a triple-gate side device or a double-gate side device) can be formed by partially etching isolation structures using only one patterned mask in one etching process, so that one end or two ends of the gate structures extend downwardly in the isolation structures. The method of manufacturing the semiconductor structure in accordance with the embodiment is easy to implement and compatible with the current process for manufacturing the planar devices. Therefore, the semiconductor structure and the method of manufacturing the same as provided in accordance with some embodiments do not increase process complexity and production cost. Also, the electrical performance of the device having the semiconductor structure in the embodiment can be improved. For example, the on-state current (Ion) of the device can be improved and the leakage current in the off state of the device can be effectively reduced.

In addition, the semiconductor structure with a multi-gate disclosed in some embodiments is positioned in an active area of a semiconductor device. Also, one active area $A_A$ and one or two isolation structures on two opposite sides of the active area $A_A$ of one semiconductor structure with a multi-gate are depicted for illustration. Also, the cross-sectional views used for illustrating various stages of manufacturing a semiconductor structure with a multi-gate and structural configurations thereof depict one or two isolation structures on two opposite sides of the active area $A_A$ are partially etched. However, the disclosure is not limited in those illustrating stages.

For the sake of simplicity and clarity, FIGS. 1A-1D, 2A-2D, 3A-3D, 4A-4D, 5A-5D, 6A-6D, 7A-7D illustrate a method of manufacturing a semiconductor structure in an electronic, in accordance with some embodiments of the present disclosure. FIGS. 1A, 2A, 3A, 4A, 5A, 6A and 7A are top views of substrates of intermediate stages of a method of manufacturing the semiconductor structure, in accordance with some embodiments. FIGS. 1B, 2B, 3B, 4B, 5B, 6B and 7B are cross-sectional views taken along sectional lines B-B' of the structures of FIGS. 1A, 2A, 3A, 4A, 5A, 6A and 7A, respectively. FIGS. 1C, 2C, 3C, 4C, 5C, 6C and 7C are cross-sectional views taken along sectional lines C-C' of the structures of FIGS. 1A, 2A, 3A, 4A, 5A, 6A and 7A, respectively. FIGS. 1D, 2D, 3D, 4D, 5D, 6D and 7D are cross-sectional views taken along sectional lines D-D' of the structures of FIGS. 1A, 2A, 3A, 4A, 5A, 6A and 7A, respectively. In some embodiments, the semiconductor structure is a three-dimensional or non-planar transistor.

Figure 1B:
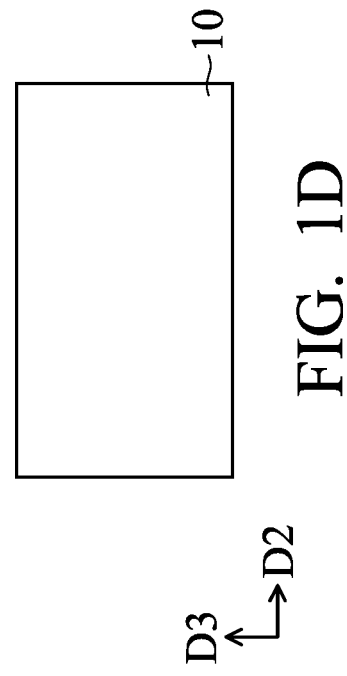
Figure 1C:
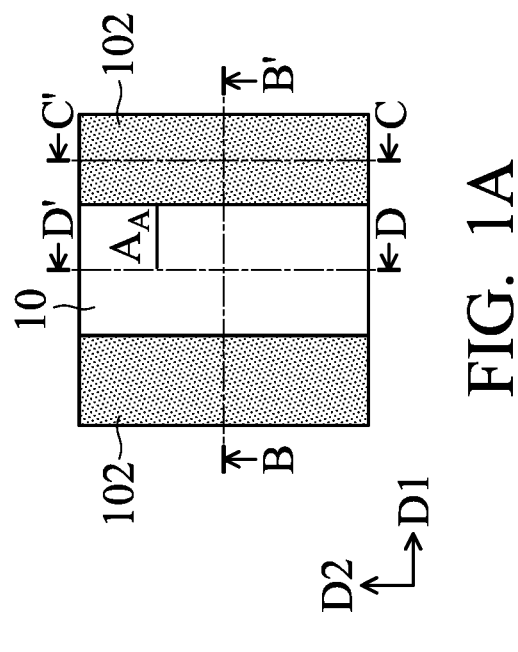
Figure 1D:
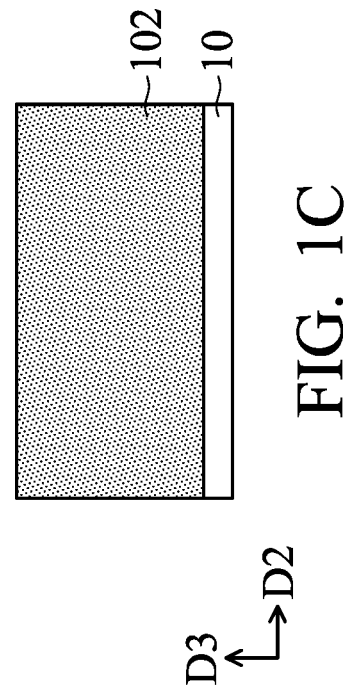

Referring to FIGS. 1A, B, 1C and 1D, a substrate 10 is provided. In some embodiments, the substrate 10 includes several isolation structures 102 and several active areas $A_A$, wherein the active areas $A_A$ are separated from each other by the isolation structures 102. As shown in FIG. 1A, it depicts one active area $A_A$ for clarity of illustration. As shown in FIG. 1A, the isolation structures 102 and the active area $A_A$ are arranged along the first direction D1, and the isolation structures 102 extend in the second direction D2. In addition, as shown in FIG. 1B, the top surfaces 102a of the isolation structures 102 are substantially level with the top surface 10a of the substrate 10.

Figure 2A:
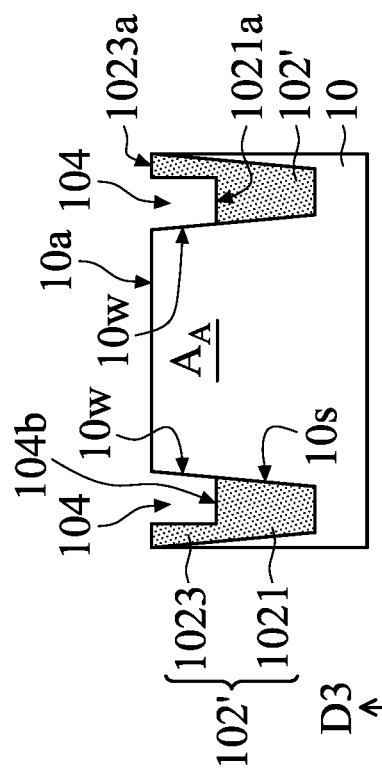
Figure 2B:
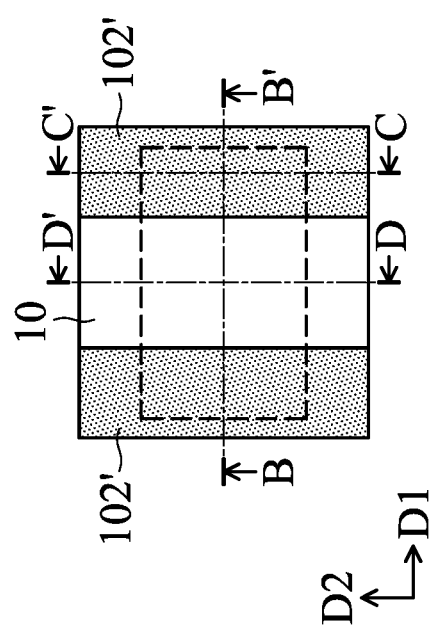
Figure 2C:
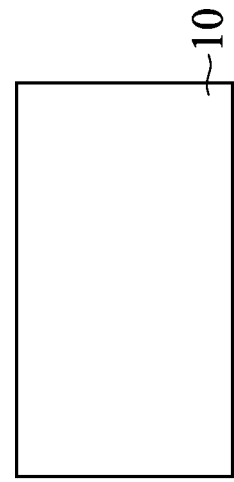
Figure 2D:
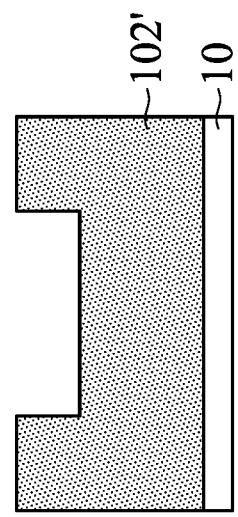

Referring to FIGS. 2A, 2B, 2C and 2D, the isolation structures 102 are partially etched to form trenches 104 in the isolation structures 102. Also, the trenches 104 expose a portion of the sidewall surfaces 10s of the substrate 10. As shown in FIG. 2B, the surface 10w of the top portion of the sidewall surfaces 10s of the substrate 10 is exposed by the trenches 104. In some embodiments, positions of the trenches 104 formed in the isolation structures 102 of the substrate 10 can be defined by using a patterned mask (not shown). Also, parts of the isolation structures 102 are removed by dry etching for forming the trenches 104.

In this embodiment, the isolation structures 102 on two opposite sides of the active area $A_A$ are partially etched simultaneously to form two trenches 104, as shown in FIG. 2B.

According to some embodiments, after the isolation structures 102 are partially etched, the remaining portion of the isolation structure 102' includes a lower portion 1021 and an upper portion 1023 on the lower portion 1021, wherein the top surface 1023a of the upper portion 1023 is substantially level with the top surface 10a of the substrate 10, as shown in FIG. 2B. Also, the top surface 1023a of the upper portion 1023 is higher than the top surface 1021a of the lower portion 1021 (i.e. the bottom surface 104b of the trench 104). Accordingly, the top surface 1023a of the upper portion 1023, the sidewall 1023s and the top surface 1021a of the lower portion 1021 form a stepwise cross-sectional profile.

Next, referring to FIGS. 3A, 3B, 3C and 3D, a gate dielectric layer 106 is formed on the substrate 10. The gate dielectric layer 106 extends to the trenches 104 and covers the surface 10w of the top portion of the sidewall surfaces 10s of the substrate 10, in accordance with some embodiments. The gate dielectric layer 106 includes at least one extending portion in the trench. As shown in FIG. 3B, the gate dielectric layer 106 includes the extending portions 1061 in the trenches 104, and the bottom surfaces 1061b of the extending portions 1061 are in contact with the lower portions 1021 of the respective isolation structures 102'.

In some embodiments, the gate dielectric layer 106 can be formed by oxidizing the substrate 10 using an oxidation process. Accordingly, the gate dielectric layer 106 can be conformably formed on the surface 10w of the top portion of the sidewall surfaces 10s of the substrate 10. In some other embodiments, the gate dielectric layer 106 can be formed by deposition and patterning processes.

Next, referring to FIGS. 4A, 4B, 4C and 4D, a gate structure 110 is formed on the gate dielectric layer 106, in accordance with some embodiments. The gate structure 110 may be a gate structure made of single conductive material layer, or a gate structure made of several conductive material layers. In this embodiment, the materials of the gate structure 110 include a polysilicon layer 108 and a metal layer 109 on the polysilicon layer 108.

Figure 4B:
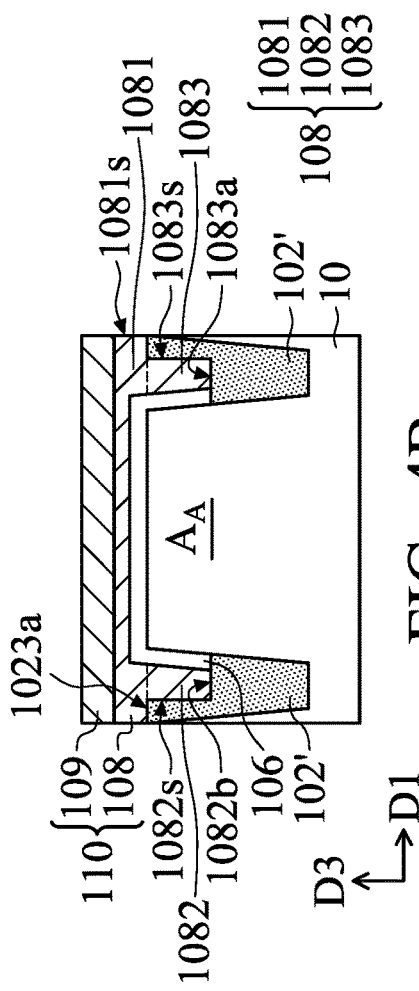
Figure 4A:
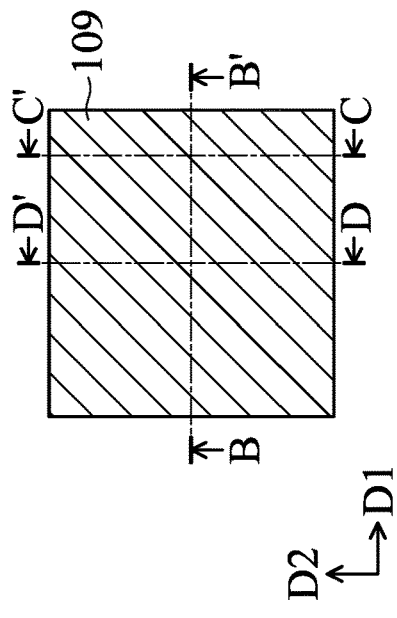
Figure 4D:
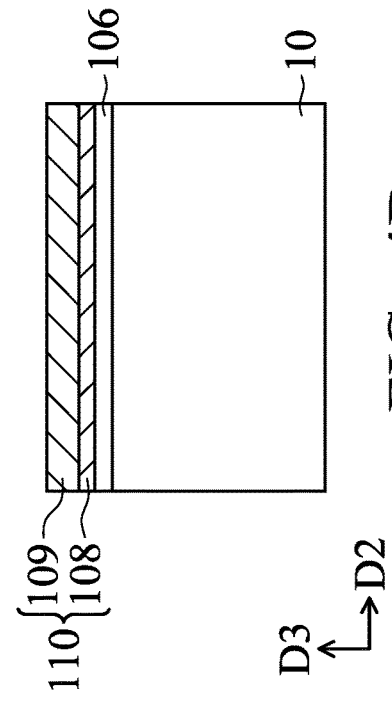
Figure 4C:
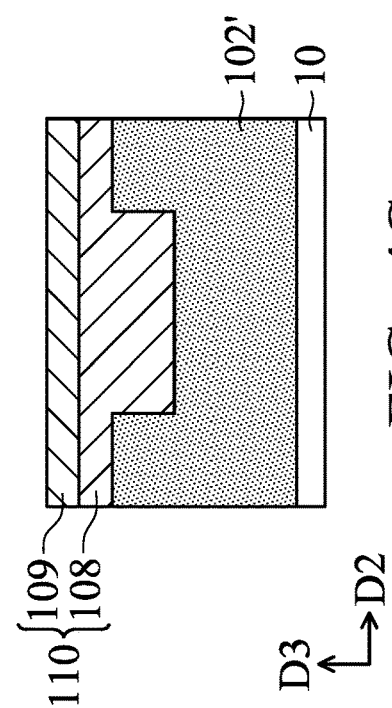

In some embodiments, the polysilicon layer 108 includes the first part 1081 on the top surface 10a of the substrate 10 and the parts in the trenches 104. Referring to FIGS. 2B and 4B, in this example, taking the position that the top surface 1023a of the upper portion 1023 (FIG. 2B) of the isolation structure 102' is substantially level with as a boundary (as indicated by the dashed line in FIG. 4B), the portion of the polysilicon layer 108 above the top surface 1023a of the isolation structure 102' is defined as the first part 1081, and other portions below the top surface 1023a (that is, positioned in the trenches 104) are defined as the second part 1082 and the third part 1083.

As shown in FIG. 4B, the second part 1082 and the third part 1083 are disposed in the trenches 104 and connected to two sides of the first part 1081. Also, the second part 1082 and the third part 1083 fill the spaces that are left by the extending portions 1061 of the gate dielectric layer 106 in the trenches 104. In some embodiments, the isolation structure 102' is in direct contact with the sidewalls and the bottom surfaces of the second part 1082 and the third part 1083, as shown in FIG. 4B. Then, a metal layer 109, including one or more metal materials such as tungsten and/or another suitable metal material, is formed on the polysilicon layer 108, thereby reducing the overall resistance of the gate structure 110.

Specifically, in some embodiments, after the gate structure 110 is formed, the lower portions 1021 of the isolation structures 102' are in contact with the bottom surface 1082b of the second part 1082 and the bottom surface 1083b of the third part 1083, as shown in FIG. 4B. Also, the upper portions 1023 of the isolation structures 102' are in contact with the sidewall 1082s of the second part 1082 and the sidewall 1083s of the third part 1083. Accordingly, the bottom surface 1082b of the second part 1082 and the bottom surface 1083b of the third part 1083 are lower than the top surfaces 1023a of the upper portions 1023 of the isolation structures 102'.

Next, referring to FIGS. 5A, 5B, 5C and 5D, a hard mask (HM) 112 is formed on the material layers for forming a gate structure in accordance with some embodiments, thereby determining the position of the gate structure to be formed subsequently. In this example, the hard mask 112 is formed on the metal layer 109. The hard mask 112 may include silicon nitride.

Figure 6B:
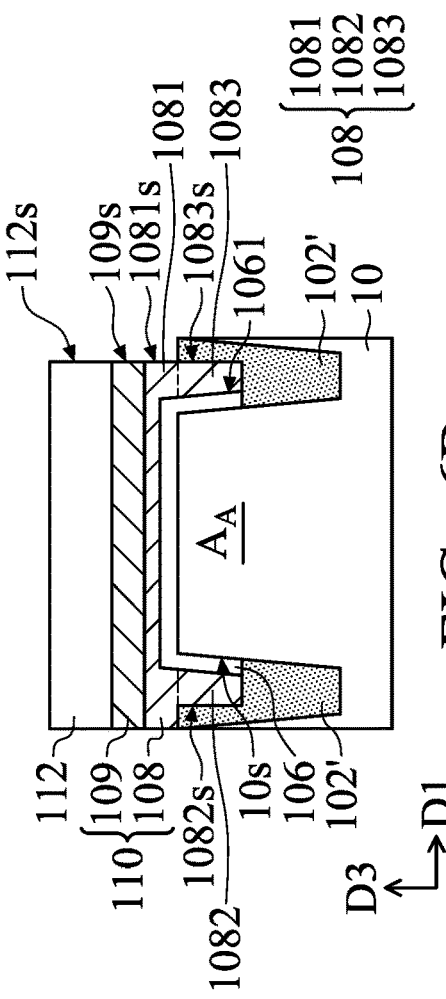
Figure 6D:
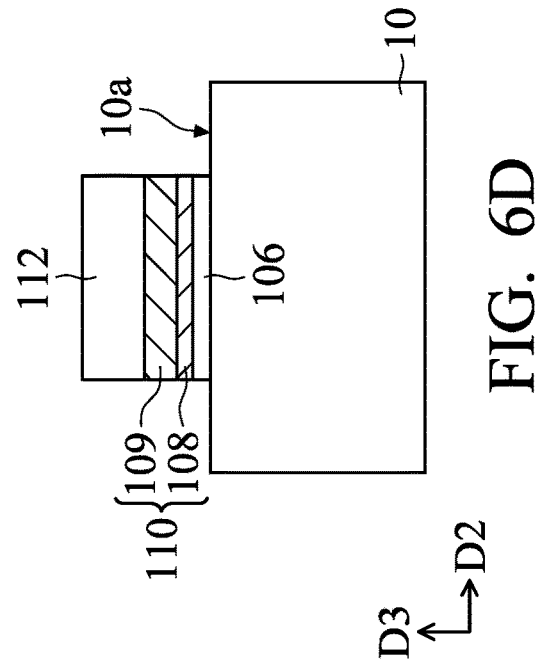
Figure 6A:
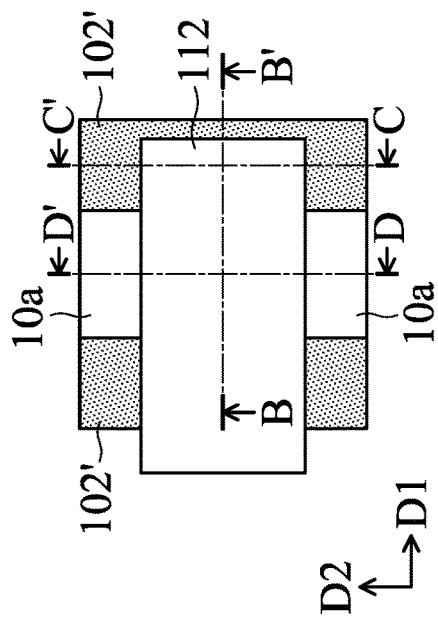
Figure 6C:
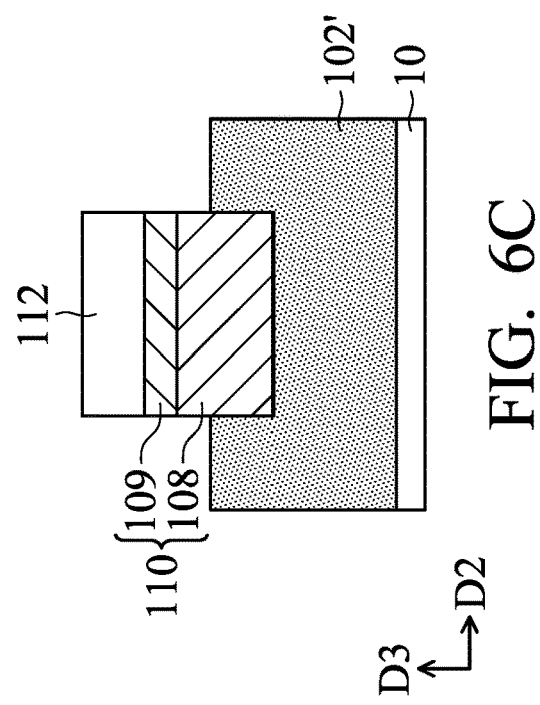

Then, referring to FIGS. 6A, 6B, 6C and 6D, the metal layer 109, the polysilicon layer and the gate dielectric layer 106 are patterned by using the hard mask 112, thereby exposing the portion of the substrate 10 uncovered by the gate structure 110 (as shown in FIG. 6A and FIG. 6D) and the portion of the isolation structure 102' uncovered by the gate structure 110 (as shown in FIG. 6C).

Figure 7B:
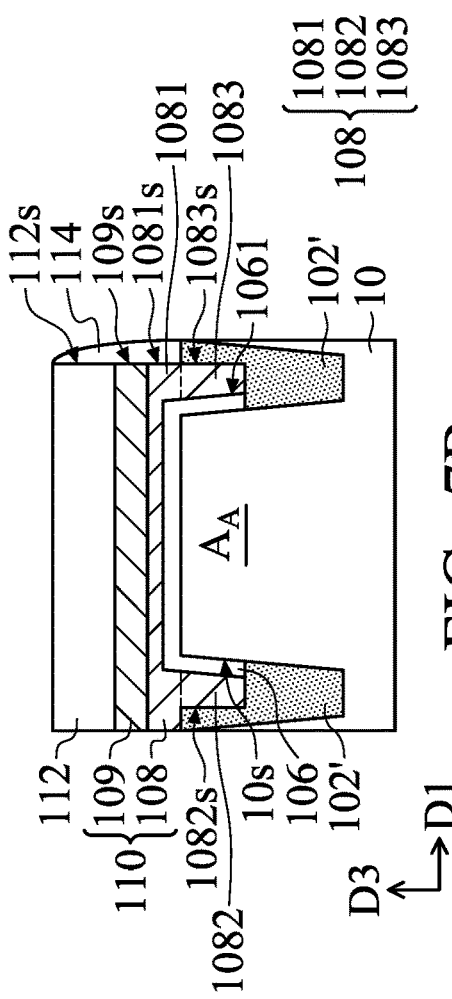
Figure 7D:
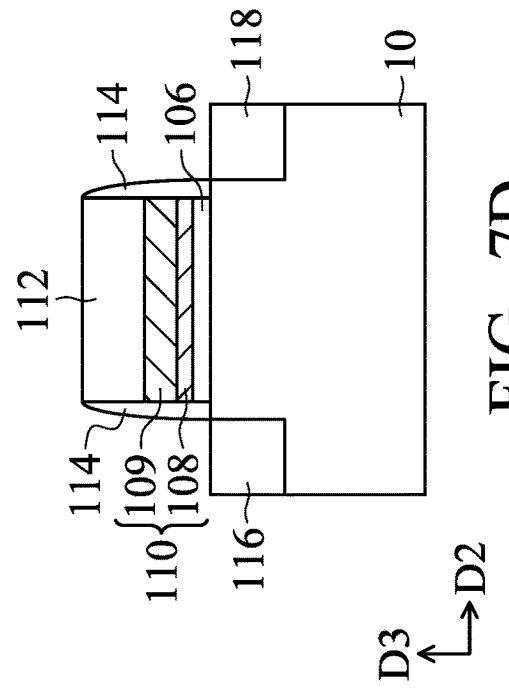
Figure 7A:
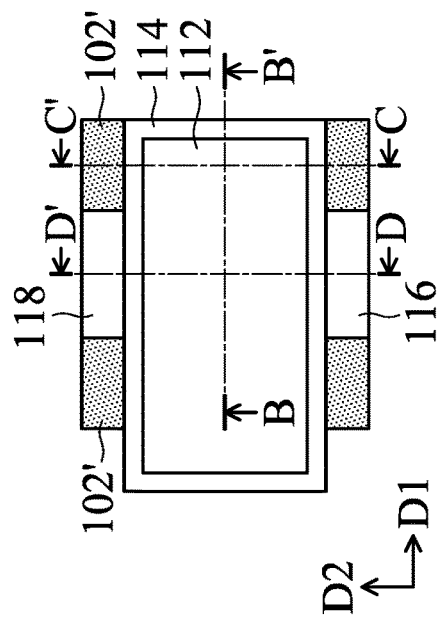
Figure 7C:
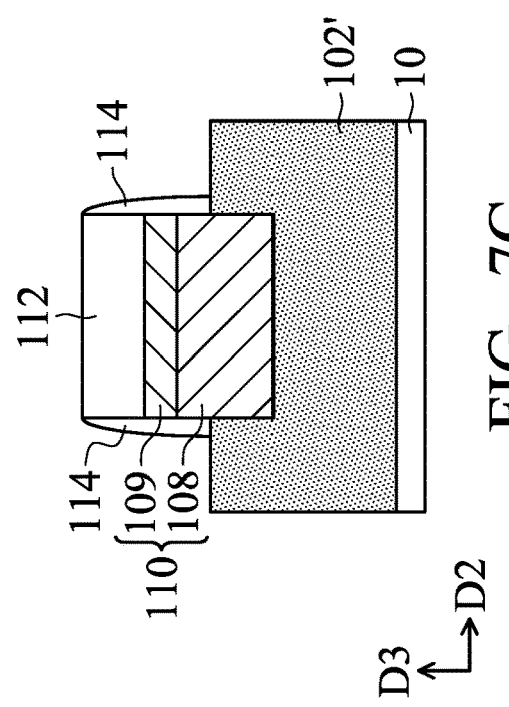

Next, spacers 114 are formed on the sidewalls of the first part 1081 of the gate structure. Referring to FIGS. 7A, 7B, 7C and 7D, the spacers 114 are formed on the sidewalls 112s of the hard mask 112, the sidewalls 109s of the metal layer 109 and the sidewalls 1081s of the first part 1081 of the polysilicon layer 108, in accordance with some embodiments. According to some embodiments of the semiconductor structure and methods of manufacturing the same, the spacers 114 are formed on the top surface of the substrate 10 and the top surfaces of the isolation structures 102'. That is, the spacers 114 are not in contact with the second part 1082 of the polysilicon layer 108 in the isolation structures 102', as shown in FIG. 7B. Afterwards, as shown in FIG. 7C and FIG. 7D, a source electrode 116 and a drain electrode 118 are formed by implanting the regions of the substrate on two opposite sides of the gate structure 110.

In some embodiments, the hard mask 112 is not removed and remains in the semiconductor structure with multi-gate. In some other embodiments, the hard mask 112 and the top portions of the spacers are removed. Then, an interlayer dielectric (ILD) layer (not shown) is deposited on the gate structure 110 and the substrate 10. Several conductive contacts (not shown) penetrating through the interlayer dielectric layer are formed to electrically connect the gate structure 110, the source electrode 116 and the drain electrode 118. Thus, the fabrication of a multi-gate device is completed.

Whether the devices include the semiconductor structures of the embodiment can be determined according to the characteristics of the devices to be formed in the application. For example, if a large driving circuit is required to drive a device to be formed, the device can be fabricated by incorporating the semiconductor structure of the embodiment. Therefore, devices formed in different regions on the same substrate may have different structures. In one example, a substrate has a first region and a second region, a multi-gate device (such as a multi-gate transistor) including the semiconductor structure of the embodiment can be formed in the first region, and a planar device (such as a planar transistor) can be formed in the second region. It should be noted that the devices are not limited to be arranged in certain regions as described herein. Dispersive arrangement of the multi-gate devices (such as multi-gate transistors) and the planar devices (such as planar transistors) on the substrate are also applicable.

FIG. 8 depicts a dispersive arrangement of several multi-gate devices 100M (such as multi-gate transistors) and several planar devices 100P (such as planar transistors) on the substrate 10. Referring to FIG. 8, only one patterned mask is required to define positions for forming the multi-gate devices 100M. It should be noted that the gate dielectric layers of the planar devices 100P and the gate dielectric layers of the multi-gate devices 100M can be formed simultaneously. In some embodiments, a patterned mask can be provided above the isolation structures 102 of the substrate 10 first to define the trenches 104 (as shown in FIG. 2B) of the multi-gate devices to be formed. Accordingly, in the subsequent fabrication, the gate dielectric layers and the gate structures above the gate dielectric layers can be extended into the trenches 104 for forming the multi-gate devices 100M, and/or formed above the substrate 10 for forming the planar devices 100P. Therefore, the method of manufacturing the semiconductor structure in accordance with the embodiment is easy to implement and compatible with the current process for manufacturing the planar devices. The semiconductor structure and the method of manufacturing the same as provided in accordance with some embodiments do not increase process complexity and production cost.

The present disclosure is not limited to the steps of simultaneously etching the isolation structures 102 on two sides of the active area $A_A$. In some embodiments, it is also applicable for only one isolation structure 102 on one side the active area $A_A$ to be etched to form a trench 104, depending on the configuration requirements of the to-be-formed device in the application. For example, if it is required that a triple-gate side device be formed in the application, both isolation structures 102 on two sides of the active area $A_A$ are etched to form the trenches 104 as described in the above embodiments, wherein the gate structure includes two parts extending into the isolation structures 102. In some other embodiments, if it is required that a double-gate side device be formed in the application, one isolation structure 102 on one side of the active area $A_A$ is etched to form a trench 104, so that the gate structure formed later includes a planar part (extending on a plane defined by the first direction D1 and the second direction D2) and a part extending into the isolation structure 102 (as shown in FIG. 9B and FIG. 9C).

Similar or identical features/components depicted in FIGS. 9A, 9B, 9C and FIGS. 1A-1D, 2A-2D, 3A-3D, 4A-4D, 5A-5D, 6A-6D, 7A-7D are designated with similar or identical reference numbers. Also, the materials and processes for manufacturing the features/components in FIGS. 9A, 9B, 9C are similar or identical to those in FIG. 1A-FIG. 7D and have been described above. For the sake of simplicity and clarity, those identical contents in FIGS. 9A, 9B, 9C are not repeated herein. The main difference between the semiconductor structures of FIGS. 9A, 9B, 9C is that the gate dielectric layers and the gate structures above the gate dielectric layers extend into two isolation structures on two sides of the active area $A_A$ (thereby forming a triple-gate side device as shown in FIG. 9A), or the gate dielectric layers and the gate structures above the gate dielectric layers are extended into one isolation structures on one side of the active area $A_A$ (thereby forming the double-gate side devices as shown in FIG. 9B and FIG. 9C).

Compared with a planar device, a multi-gate device (such as a triple-gate side device and a double-gate side device) has a wider gate width, thereby increasing the on-state current (Ion). Several simulation experiments were performed on the planar device (as a comparative example) and the semiconductor structures with multi-gate. The results of the simulation experiments are described below. Also, the relevant parameters of the simulation experiments and the increase of the on-state current (Ion) achieved by the semiconductor structures with a multi-gate are shown in Table 1.

Referring to FIG. 9A, which shows the gate widths of three parts of the polysilicon layer 108 of the gate electrode 110. The contact length of the first part 1081 between the gate dielectric layer 106 and the top surface 10a of the substrate 10 is defined as the first width W1. The depths of the second part 1082 and the third part 1083 along the extending direction of the isolation structure 102 are defined as the second width W2 and the third width W3, respectively. The second width W2 is smaller than the first width W1, and the third width W3 is smaller than the first width W1, as shown in FIG. 9A. In this embodiment, the total width of the gate electrode 110 is equal to the sum of the first width W1, the second width W2 and the third width W3. The second width W2 may be equal to or not equal to the third width W3.

In some embodiments, the second width W2 is less than or equal to ½ of the first width W1, and greater than ⅛ of the first width W1. Similarly, the third width W3 is less than or equal to ½ of the first width W1, and greater than ⅛ of the first width W1. In some other embodiments, the second width W2 is less than or equal to ½ of the first width W1, and greater than ¼ of the first width W1. Similarly, the third width W3 is less than or equal to ½ of the first width W1, and greater than ¼ of the first width W1. It should be noted that those numerical values of the ratios of the gate widths are provided merely for exemplification, not for limiting the scope of the present disclosure.

In the simulation experiments, the depth of the isolation structure 102 (such as along the third direction D3) of the semiconductor structure in accordance with some embodiments is about 0.425 μm. Also, the first widths W1 of the semiconductor structures in the simulation experiments vary as 0.2 μm, 0.3 μm and 0.4 μm, while the second width W2 and/or the third width W3 are/is equal to 0.05 μm. According to the results of the simulation experiments in Table 1, the on-state current (Ion) of the semiconductor structures in accordance with some embodiments can be improved by more than about 12.5% and even up to about 50%, compared with a planar semiconductor structure (that is, the gate only including the first part 1081 with the first widths W1 in the structure).

TABLE 1

| | First Width W1 (μm) | Second Width W2 (μm) | Third Width W3 (μm) | Overall Width (μm) | Improvement of on-state current (Ion) (%) |
|---|---|---|---|---|---|
| Triple-gate side device (i.e. two parts of the gate electrode disposed in the isolation structures) | 0.4 | 0.05 | 0.05 | 0.5 | 25.0% |
| | 0.3 | | | 0.4 | 33.3% |
| | 0.2 | | | 0.3 | 50.0% |
| Double-gate side device (i.e. one part of the gate electrode disposed in one isolation structure) | 0.4 | 0.05 | 0 | 0.45 | 12.5% |
| | 0.3 | | | 0.35 | 16.7% |
| | 0.2 | | | 0.25 | 25.0% |

According to the results in Table 1, when the second width W2 is equal to 0.05 μm, more significant improvement of the on-state current (Ion) is achieved with the increase of the ratio of the second width W2 to the first width W1. Compared with a planar semiconductor structure (that is, the gate only including the first part 1081 with the first widths W1 in the structure), when the ratio of the second width W2 to the first width W1 is ¼, the on-state current (Ion) of the semiconductor structure in accordance with some embodiments is improved by 25%. Also, when the semiconductor structures have the same first width W1, the improvement of the on-state current (Ion) that is achieved by the gate structure having two parts extending in the isolation structures (i.e. each of the second width W2 and the third width W3 is 0.05 μm) is greater than the improvement of the on-state current (Ion) that is achieved by the gate structure having one part extending in the isolation structure (i.e. the second width W2 is 0.05 m and the third width W3 is 0 μm). For example, when the first width W1 is 0.2 μm, compared with the semiconductor structures with and without the third part 1083, the improvement of the on-state current (Ion) is increased from 25% to 50%.

In addition, the semiconductor structures of the embodiments can be varied and modified to meet the requirements in the applications. For example, the components of the semiconductor structures formed on two sides of an isolation structure 102 can be modified according to the configurations of the semiconductor structures, such as the width of the isolation structure 102. Similar or identical features/components depicted in FIGS. 10A, 10B and FIGS. 9A, 9B, 9C are designated with similar or identical reference numbers. Also, for the sake of simplicity and clarity, the materials and processes for manufacturing the features/components in FIGS. 10A and 10B similar or identical to those in FIGS. 1A-1D, 2A-2D, 3A-3D, 4A-4D, 5A-5D, 6A-6D, 7A-7D and FIG. 9A-9C have been described above, and are not repeated herein.

Figure 10A:
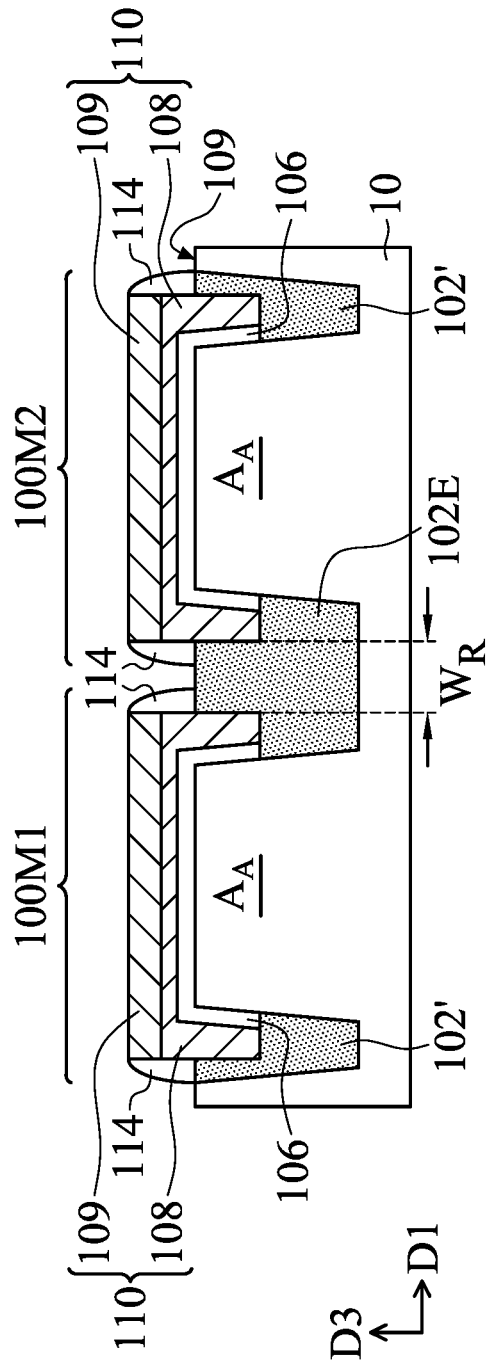
FIGS. 10A and 10B are cross-sectional views of two adjacent semiconductor structures, in accordance with some embodiments of the present disclosure.

In some embodiments, when it is determined to form a device on a substrate, the width of the isolation structure 102 of the substrate cannot be too large. Otherwise the top surface of the isolation structure 102 may have a dishing defect after a planarization process, such as chemical mechanical polishing (CMP), is performed. According to some embodiments of the semiconductor structure, one isolation structure 102E is formed to separate two active areas that are provided for forming the multi-gate devices 100M1 and 100M2, as shown in FIG. 10A. When the width of the isolation structure 102E is restricted to a certain range (i.e. the isolation structure 102E cannot be too wide), the isolation structure 102E can be partially etched according to some embodiments of the aforementioned manufacturing method to form two gate structures 110 of the multi-gate devices 100M1 and 100M2, respectively. Therefore, the parts of the gate structures 110 extending into the isolation structure 102E can still be isolated from each other by the isolation material of the isolation structure 102E. For example, as shown in FIG. 10A, the isolation structure 102E is disposed between the polysilicon layers 108 of the multi-gate devices 100M1 and 100M2, wherein the isolation structure 102E level with the top surface 10a of the substrate 10 still has a sufficient width $W_R$ along the first direction D1 for achieving the electrical isolation between the multi-gate devices 100M1 and 100M2.

Figure 10B:
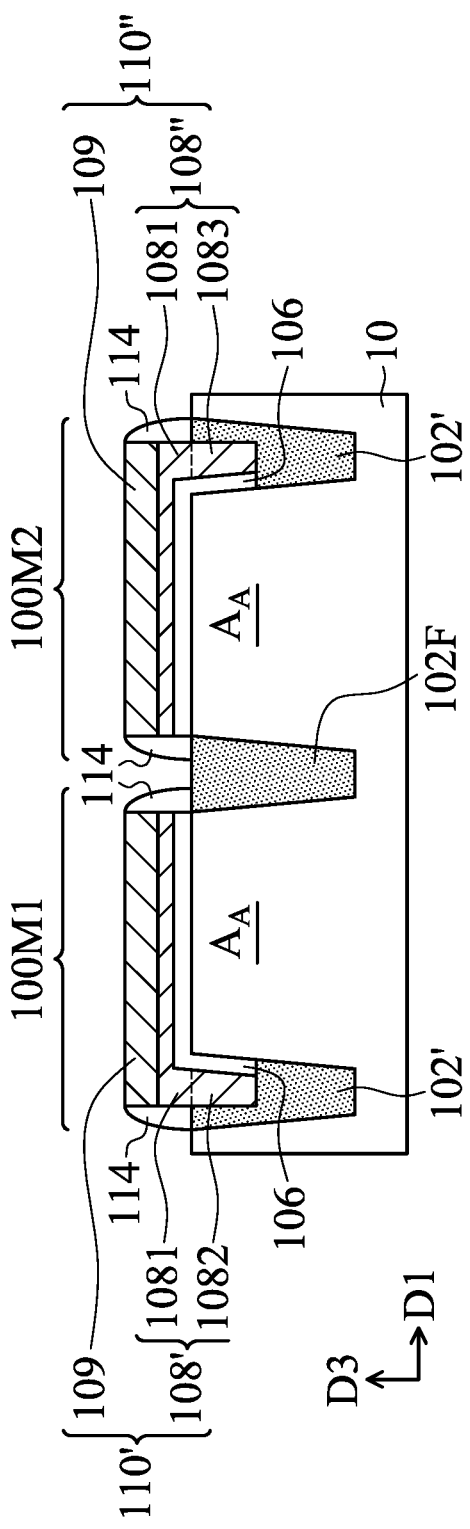

In some other embodiments, as shown in FIG. 10B, the semiconductor structures depicted in FIG. 9B and FIG. 9C can be formed in two active areas separated by an isolation structure 102F, thereby preventing undesirable parasitic capacitance induced by extending parts of the two multi-gate devices. As shown in FIG. 10B, the multi-gate device 100M1 includes the gate structure 110', wherein the polysilicon layer 108' of the gate structure 110' includes the first part 1081 and the second part 1082. The multi-gate device 100M2 includes the gate structure 110", wherein the polysilicon layer 108" of the gate structure 110" includes the first part 1081 and the third part 1083. Also, the isolation structure 102F between the multi-gate devices 100M1 and 100M2 remains intact without partial etching. Therefore, the second part 1082 of the multi-gate device 100M1 and the third part 1083 of the multi-gate device 100M2 are separated at least by the active areas $A_A$ of the substrate 10 and the isolation structure 102F. Parasitic capacitance induced by the second part 1082 of the multi-gate device 100M1 and the third part 1083 of the multi-gate device 100M2 would not be easily generated.

It should be noted that the gate dielectric layers 106 of those multi-gate devices are separated from each other. Take the multi-gate devices 100M1 and 100M2 shown in FIG. 10A or FIG. 10B for example, the gate dielectric layers 106 of the multi-gate devices 100M1 and 100M2 are separated from each other. Each of the gate dielectric layers 106 of the multi-gate devices 100M1 and 100M2 is formed on the surface 10w of the top portion of the sidewall surfaces 10s of the substrate 10. The gate dielectric layers 106 of the multi-gate devices 100M1 and 100M2 are not physically connected to each other.

Figure 11:
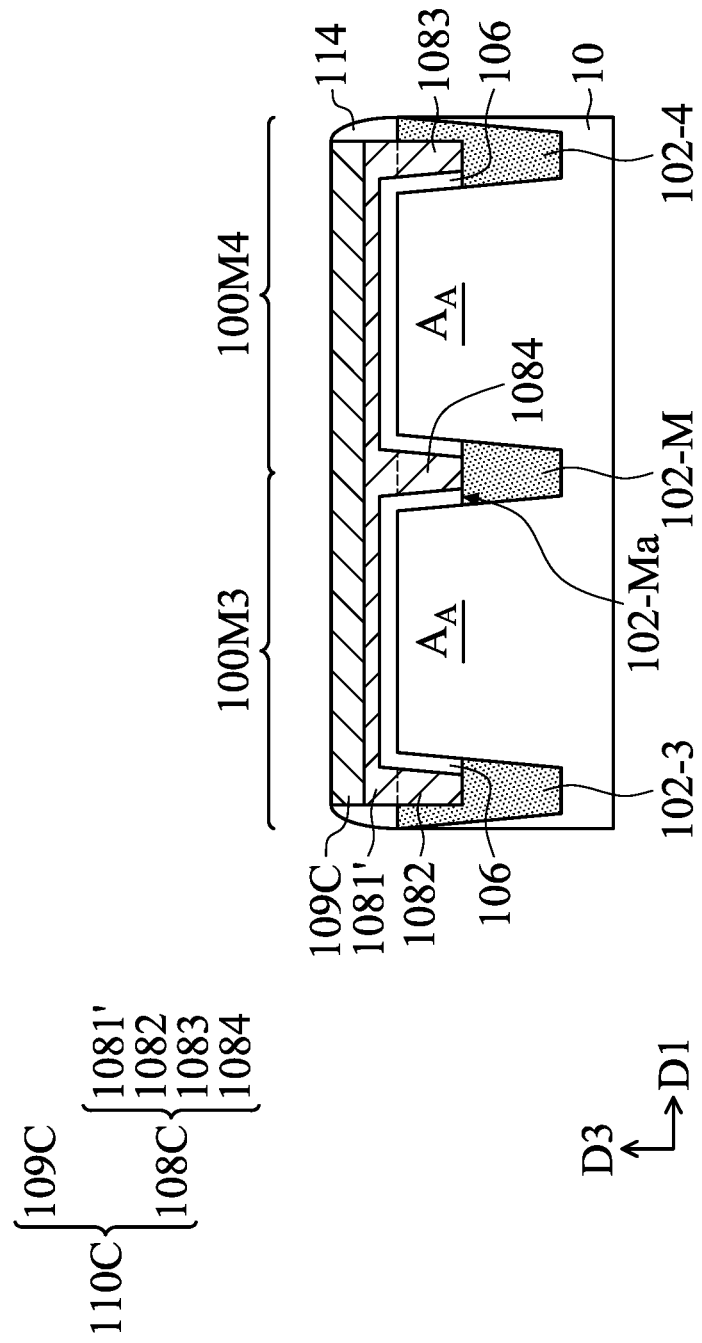
FIG. 11 is a cross-sectional view of two adjacent semiconductor structures, in accordance with some embodiments of the present disclosure.

Moreover, the semiconductor structures in accordance with some embodiments can be varied and modified according to the design conditions in the applications. FIG. 11 is a cross-sectional view of two adjacent semiconductor structures, in accordance with some embodiments of the present disclosure. Similar or identical features/components depicted in FIG. 11 and FIGS. 9A, 9B, 9C, 10A, 10B are designated with similar or identical reference numbers. Also, for the sake of simplicity and clarity, the materials and processes for manufacturing the features/components in FIG. 11 similar or identical to those in aforementioned embodiments are not repeated herein. As shown in FIG. 11, a common gate electrode 110C of the multi-gate devices 100M3 and 100M4 is provided, and the common gate electrode 110C includes a common metal layer 109C and a common polysilicon layer 108C. The common polysilicon layer 108C includes the first part 1081', the second part 1082, the third part 1083 and the fourth part 1084, wherein the second part 1082, the third part 1083 and the fourth part 1084 connect the first part 1081'. Also, the second part 1082 is disposed in the partially-etched isolation structure 102-3 of the multi-gate device 100M3. The third part 1083 is disposed in the partially-etched isolation structure 102-4 of the multi-gate device 100M4. The fourth part 1084 is disposed in the etched isolation structure 102-M in the active area $A_A$ between the multi-gate devices 100M3 and 100M4. As shown in FIG. 11, the top surface 102-Ma is substantially in parallel with the top surface 10a of the substrate 10 and lower than the top surface 10a of the substrate 10. The gate electrodes of the multi-gate devices 100M3 and 100M4 are connected to each other by the fourth part 1084 of the common polysilicon layer 108C.

The aforementioned semiconductor structures and methods of manufacturing the semiconductor structures, in accordance with some embodiments of the present disclosure, have several advantages. For example, whether the devices include the semiconductor structures of the embodiment can be optionally determined according to the characteristics of the devices to be formed in the application. Also, multi-gate devices (such as a triple-gate side device and a double-gate side device) in the embodiments can be formed by partially etching the isolation structures 102 using only one patterned mask in one etching process. Also, compared with a planar device, the multi-gate devices, in accordance with some embodiments, can increase the gate width, thereby improving the on-state current (Ion). Also, the method of manufacturing the semiconductor structure in accordance with the embodiment is easy to implement and compatible with the current process for manufacturing the planar devices. Therefore, the semiconductor structure and the method of manufacturing the same as provided in accordance with some embodiments do not increase process complexity and production cost.

In addition, if a conventional planar device is driven by a large driving circuit, an undesirable leakage current in the off state (Ioff) of the device occurs. In some embodiments of the semiconductor structure (i.e. the multi-gate device), the leakage current in the off state can be decreased due to the electric field created by the part of the gate electrode that extends into the isolation structure 102. That is, if the semiconductor structure in the embodiment is driven by a large driving circuit, the leakage current in the off state can be effectively decreased. Also, the partially-etched isolation structure may facilitate the decrease of the coupling capacitance between the gate electrodes of adjacent semiconductor structures.

Furthermore, in some embodiments of the semiconductor structures, it can be determined to form the triple-gate side device (as shown in FIGS. 7B. 9A, 10A and 11) or the double-gate side device (as shown in FIGS. 9B, 9C and 10B) depending on the conditions and requirements in the applications. For example, two double-gate side devices as shown in FIG. 10B can be formed on two sides of an isolation structure when the isolation structure has a small width, thereby preventing undesirable parasitic capacitance. In some other embodiments, one triple-gate side device as shown in FIG. 9A and one double-gate side device as shown in FIG. 9C can be formed on two sides of an isolation structure, if the isolation structure have a sufficient width for disposing a part of the gate electrode of the triple-gate side device. The disclosure does not limit the configurations of the semiconductor structures adopted in the applications.

Also, according to some embodiments of the semiconductor structure with multi-gate, one end or two ends of the gate structures extend downwardly in the isolation structures, so that the thickness of the portion of the gate electrode (such as the first part 1081 of the polysilicon layer 108 and the metal layer 109) above the top surface 10a of the substrate 10 is the same as the gate electrode of the conventional planar device. Thus, the semiconductor structures provided in the embodiments do not increase the height of the gate electrode above the top surface 10a of the substrate 10, and still have the configuration similar to the planar-like semiconductor structure. Furthermore, in a conventional fin field-effect transistor (FinFET) that the gate electrode covers the fin with a high height and has a very high sidewall, an undesirable parasitic capacitance will be induced between the sidewalls of the gate electrodes of adjacent devices (such as transistors). According to some embodiments of the semiconductor structure with multi-gate, the undesirable parasitic capacitance typically generated in the conventional fin field-effect transistor can be prevented. Also, since the semiconductor structure in the embodiments only forms low spacers 114, and does not increase the height of the gate electrode above the top surface 10a of the substrate 10, the problem typically occurred in the conventional FinFET, that the very high spacers on the sidewalls of the gate electrodes are easily collapsed and/or peeled off from the sidewalls, will not be occurred. Thus, a semiconductor structure with a good profile can be obtained by using the method of manufacturing the semiconductor structure in the embodiments of the present disclosure. Also, the components of the semiconductor structure of the embodiments do not have excessive heights, and the overall structure is stable. Therefore, the production yield of the semiconductor structure can be increased, and the electrical performance of the device having the semiconductor structure in the embodiment can be improved.

While the disclosure has been described by way of example and in terms of the preferred embodiments, it should be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor structure with a multi-gate, comprising:
    a substrate having an active area and an isolation structure adjacent to the active area;
    a gate structure of a multi-gate device formed on the substrate, and the gate structure comprising:
    a first part above a top surface of the substrate; and
    a second part connected to the first part, wherein the second part is formed in the isolation structure, and the isolation structure is in direct physical contact with a bottom surface and sidewalls of the second part; and
    a gate dielectric layer between the gate structure and the substrate,
    wherein a topmost surface of the isolation structure is coplanar with a topmost surface of the substrate,
    wherein a planar gate of a planar device is formed on the substrate, and a thickness of the planar gate above the top surface of the substrate is the same as a thickness of the first part of the gate structure.

2. The semiconductor structure with the multi-gate as claimed in claim 1, wherein the gate dielectric layer comprises an extending portion in the isolation structure, and the extending portion is disposed between the second part of the gate structure and the substrate.

3. The semiconductor structure with the multi-gate as claimed in claim 2, wherein a bottom surface of the extending portion of the gate dielectric layer is in contact with the isolation structure.

4. The semiconductor structure with the multi-gate as claimed in claim 3, wherein the bottom surface of the extending portion of the gate dielectric layer is lower than the topmost surface of the substrate.

5. The semiconductor structure with the multi-gate as claimed in claim 1, wherein a contact length of the first part between the gate dielectric layer and the topmost surface of the substrate is defined as a first width, and a depth of the second part along an extending direction of the isolation structure is defined as a second width, wherein the second width is smaller than the first width.

6. The semiconductor structure with the multi-gate as claimed in claim 1, wherein the isolation structure comprises a lower portion and an upper portion on the lower portion, a topmost surface of the upper portion is level with the topmost surface of the substrate.

7. The semiconductor structure with the multi-gate as claimed in claim 6, wherein the upper portion and the lower portion form a stepwise cross-sectional profile.

8. The semiconductor structure with the multi-gate as claimed in claim 6, wherein the lower portion of the isolation structure is in contact with the bottom surface of the second part of the gate structure and a bottom surface of an extending portion of the gate dielectric layer, and the upper portion of the isolation structure is in contact with the sidewalls of the second part.

9. The semiconductor structure with the multi-gate as claimed in claim 1, further comprising:
spacers on sidewalls of the first part of the gate structure, wherein the spacers are not in contact with the second part.

10. The semiconductor structure with the multi-gate as claimed in claim 1, wherein the second part is connected to one side of the first part, the gate structure further comprises a third part connected to another side of the first part, and the third part extends to another isolation structure, wherein a bottom surface and sidewalls of the third part are covered by said another isolation structure.

11. The semiconductor structure with the multi-gate as claimed in claim 10, wherein a contact length of the first part between the gate dielectric layer and the topmost surface of the substrate is defined as a first width, and a depth of the third part along an extending direction of said another isolation structure is defined as a third width, wherein the third width is smaller than the first width.

12. The semiconductor structure with the multi-gate as claimed in claim 1, wherein the substrate comprises a first region and a second region, and the planar device is disposed in the second region.

13. The semiconductor structure with the multi-gate as claimed in claim 12, wherein a plurality of multi-gate devices are disposed in the first region, and each of the plurality of multi-gate devices includes the gate structure and the gate dielectric layer, wherein the gate dielectric layers of the plurality of multi-gate devices are separated from each other.

14. The semiconductor structure with the multi-gate as claimed in claim 12, wherein the gate structure comprises metal, or a combination of metal and polysilicon.

15. A method of manufacturing a semiconductor structure with a multi-gate, comprising:
providing a substrate, the substrate having an active area and an isolation structure adjacent to the active area, wherein a top surface of the isolation structure is level with a topmost surface of the substrate;
partially etching the isolation structure to form a trench, wherein the trench exposes a top portion of sidewall surfaces of the substrate, and a topmost surface of remaining portions of the isolation structure in the trench is coplanar with the topmost surface of the substrate;
forming a gate dielectric layer of a multi-gate device and a planar gate dielectric of a planar device on the substrate, the gate dielectric layer extending to the trench and covering the top portion of the sidewall surfaces of the substrate; and
forming a gate structure on the gate dielectric layer of the multi-gate device and a planar gate on the planar gate dielectric of the planar device, wherein the gate structure comprises:
a first part above the topmost surface of the substrate; and
a second part connected to the first part, wherein the second part is formed in the trench, and the isolation structure is in direct physical contact with sidewalls and a bottom surface of the second part,
wherein a thickness of the planar gate above a top surface of the substrate is the same as a thickness of the first part of the gate structure.

16. The method of manufacturing the semiconductor structure with the multi-gate as claimed in claim 15, wherein after the isolation structure is partially etched, a remaining portion of the isolation structure includes a lower portion and an upper portion on the lower portion, wherein a topmost surface of the upper portion is level with the topmost surface of the substrate; and
after the gate structure is formed, the lower portion of the isolation structure is in contact with the bottom surface of the second part of the gate structure and a bottom surface of an extending portion of the gate dielectric layer, and the upper portion of the isolation structure is in contact with the sidewalls of the second part.

17. The method of manufacturing the semiconductor structure with the multi-gate as claimed in claim 15, further comprising:
forming spacers on sidewalls of the first part of the gate structure, wherein the spacers are not in contact with the second part.

18. The method of manufacturing the semiconductor structure with the multi-gate as claimed in claim 15, wherein the substrate further comprises another isolation structure, and the method comprises:
partially etching the isolation structures to form two trenches on opposite sides of the active area, the gate structure further comprises a third part connected to another side of the first part, the third part extends to another isolation structure, and a bottom surface and sidewalls of the third part are covered by said another isolation structure.

* * * * *